United States Patent
Ellis-Monaghan et al.

(10) Patent No.: US 7,888,156 B2
(45) Date of Patent: Feb. 15, 2011

(54) PREDOPED TRANSFER GATE FOR A CMOS IMAGE SENSOR

(75) Inventors: John Ellis-Monaghan, Grand Isle, VT (US); Jeffrey B. Johnson, Essex Junction, VT (US); Alain Loiseau, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 11/864,713

(22) Filed: Sep. 28, 2007

(65) Prior Publication Data

US 2009/0035886 A1 Feb. 5, 2009

Related U.S. Application Data

(62) Division of application No. 10/904,896, filed on Dec. 3, 2004, now Pat. No. 7,288,788.

(51) Int. Cl.
*H01L 31/068* (2006.01)
(52) U.S. Cl. ............................ 438/57; 438/73; 438/286; 438/525; 257/E31.073
(58) Field of Classification Search ............... 438/57, 438/73, 286, 525, FOR. 190, FOR. 415; 257/E31.703
See application file for complete search history.

(56) References Cited

U.S. PATENT DOCUMENTS

| | | | |
|---|---|---|---|
| 6,180,535 B1 * | 1/2001 | Wu et al. ............... | 438/734 |
| 6,306,678 B1 | 10/2001 | Chiang et al. | |
| 6,512,280 B2 * | 1/2003 | Chen et al. ............... | 257/465 |
| 6,731,337 B2 | 5/2004 | Watanabe | |
| 6,768,149 B1 | 7/2004 | Mann et al. | |
| 6,812,539 B1 * | 11/2004 | Rhodes ............... | 257/435 |
| 6,818,930 B2 * | 11/2004 | Mouli et al. ............ | 257/215 |
| 6,878,568 B1 * | 4/2005 | Rhodes et al. ............. | 438/73 |
| 6,960,795 B2 * | 11/2005 | Rhodes ............... | 257/215 |
| 7,087,944 B2 * | 8/2006 | Rhodes et al. ............ | 257/292 |
| 7,537,999 B2 * | 5/2009 | Han ............... | 438/286 |
| 2004/0188727 A1 | 9/2004 | Patrick | |
| 2004/0211987 A1 * | 10/2004 | Chien et al. ............ | 257/225 |
| 2005/0001248 A1 * | 1/2005 | Rhodes ............... | 257/292 |
| 2005/0064665 A1 * | 3/2005 | Han ............... | 438/286 |
| 2008/0179639 A1 * | 7/2008 | Gambino et al. ............ | 257/291 |

* cited by examiner

*Primary Examiner*—George Fourson
(74) *Attorney, Agent, or Firm*—Scully, Scott, Murphy & Presser, P.C.; Anthony J. Canale

(57) ABSTRACT

A novel CMOS image sensor Active Pixel Sensor (APS) cell structure and method of manufacture. Particularly, a CMOS image sensor APS cell having a predoped transfer gate is formed that avoids the variations of $V_t$ as a result of subsequent manufacturing steps. According to the preferred embodiment of the invention, the CMOS image sensor APS cell structure includes a doped p-type pinning layer and an n-type doped gate. There is additionally provided a method of forming the CMOS image sensor APS cell having a predoped transfer gate and a doped pinning layer. The predoped transfer gate prevents part of the gate from becoming p-type doped.

8 Claims, 5 Drawing Sheets

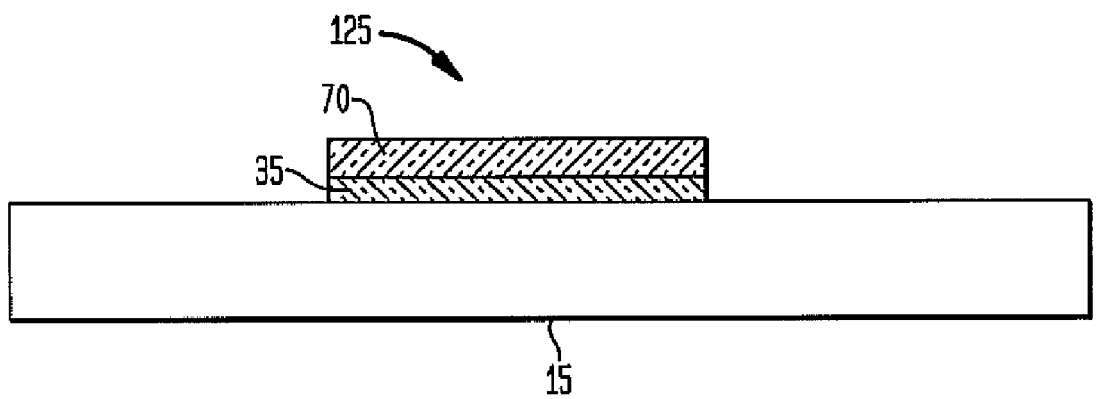
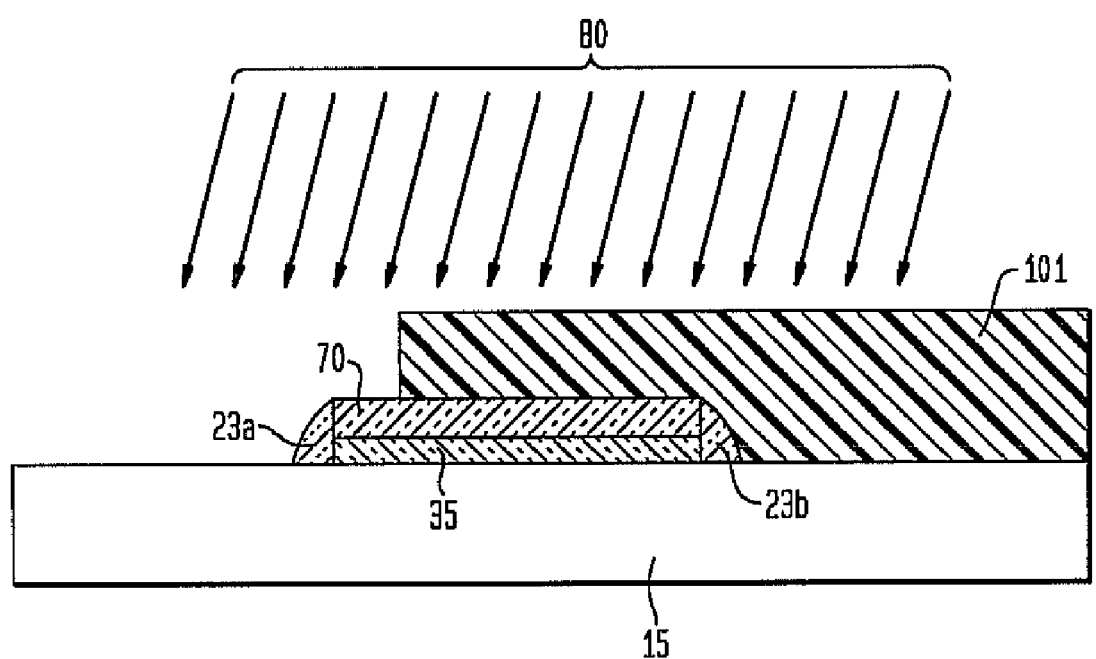

PREDOPED TRANSFER GATE FOR A CMOS IMAGE SENSOR

RELATED APPLICATIONS

This application is a divisional of U.S. application Ser. No. 10/904,896, filed Dec. 3, 2004 now U.S. Pat. No. 7,288,788.

FIELD OF THE INVENTION

The present invention related generally to the fabrication of semiconductor pixel imager arrays, and more particularly, to a novel Active Pixel Sensor (APS) cell structure including a novel transfer gate and process therefor.

BACKGROUND OF THE INVENTION

CMOS image sensors are beginning to replace conventional CCD sensors for applications requiring image pick-up such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

Current CMOS image sensors comprise an array of CMOS Active Pixel Sensor (APS) cells, which are used to collect light energy and convert it into readable electrical signals. Each APS cell comprises a photosensitive element, such as a photodiode, photogate, or photoconductor overlying a doped region of a substrate for accumulating photo-generated charge in an underlying portion thereof. A read-out circuit is connected to each pixel cell and often includes a diffusion region for receiving charge from the photosensitive element, when read-out. Typically, this is accomplished by a transistor device having a gate electrically connected to the floating diffusion region. The imager may also include a transistor, having a transfer gate, for transferring charge from the photosensitive element to the floating diffusion region, and a transistor for resetting the floating diffusion region to a predetermined charge level prior to charge transfer.

As shown in FIG. 1, a typical CMOS APS cell 10 includes a pinned photodiode 20 having a pinning layer 18 doped p-type and, an underlying lightly doped n-type region 17. Typically, the pinned diode 20 is formed on top of a p-type substrate 15 or a p-type epitaxial layer or p-well surface layer having a lower p-type concentration than the diode pinning layer 18. The n– region 17 and p region 18 of the photodiode 20 are typically spaced between an isolation region (not shown) and a charge transfer transistor gate 25 which are surrounded by thin spacer structures 23a,b. The photodiode 20 thus has two p-type regions 18 and 15 having a same potential so that the n– region 17 is fully depleted at a pinning voltage (Vp). The pinned photodiode is termed "pinned" because the potential in the photodiode is pinned to a constant value, Vp, when the photodiode is fully depleted. In operation, light coming from the pixel is focused down onto the photodiode through the diode where electrons collect at the n-type region 17. When the transfer gate 25 is operated, i.e., turned on, the photo-generated charge is transferred from the charge accumulating doped n⁻ type region 17 via a transfer device surface channel 16 to a floating diffusion region 30 which is doped n+ type.

In conventional processes for fabricating the pinning layer 18 over the photodiode in the prior art APS cell 10 shown in FIG. 1, it is the case that some amount of p-type doping 29 overlaps onto the transfer gate 25 which is normally formed of intrinsic polysilicon or low level p-type doped 27. This is a result of mask overlay tolerance or displacement of the mask edge during fabrication. Subsequently, during formation of the n+ type doped floating diffusion region 30, the gate is processed to include a low level n– type doped region 28. The presence of this p doping has an effect of reducing the efficiency and dynamic range of the gate, particularly by causing variations in transfer gate voltage thresholds ($V_t$). This will cause the transfer gate to not turn on completely. Also, because of lithographic alignment issues, the position of the p 'overlap' onto the gate varies, leading to performance variability.

It would thus be highly desirable to provide a CMOS image sensor APS cell and method of manufacture that avoids these limitations.

SUMMARY OF THE INVENTION

This invention addresses a novel CMOS image sensor APS cell structure and method of manufacture. Particularly, a CMOS image sensor APS cell having a predoped transfer gate is formed that avoids the variations of $V_t$ as a result of the subsequent manufacturing steps. According to the embodiment of the invention, the CMOS image sensor APS cell structure includes a doped p-type pinning layer and an n-type doped gate. There is additionally provided a method of forming the CMOS image sensor APS cell having a predoped transfer gate and a doped pinning layer. The predoped transfer gate prevents part of the gate from becoming p-type doped.

According to a first aspect of the invention, there is provided an Active Pixel Sensor (APS) cell structure for an image sensor and method of manufacture that comprises steps of: forming a layer of dielectric material over a semiconductor substrate; forming a gate layer of polysilicon material atop the dielectric material layer; doping the gate layer of polysilicon material with an n-type dopant material; performing an etch process to the n-type doped gate layer to form a predoped transfer gate; forming a p-type doped material pinning layer at the substrate surface at a first side of the predoped transfer gate; forming an n-type doped collection well area beneath the p-type doped material pinning layer; and, forming a n-type doped diffusion layer at the substrate surface at an opposite side of the predoped transfer gate.

According to one aspect of the invention, the formed gate layer of polysilicon material is in-situ doped with n-type dopant material prior to forming it atop the dielectric material layer.

BRIEF DESCRIPTION OF THE DRAWINGS

The objects, features and advantages of the present invention will become apparent to one skilled in the art, in view of the following detailed description taken in combination with the attached drawings, in which:

FIGS. 2(a)-2(f) depicts, through cross-sectional views, the process steps for forming the CMOS APS cell 100 of the present invention and resulting in the structure shown in FIG. 2(f);

DETAILED DESCRIPTION OF THE PREFERRED EMBODIMENTS

Figure 2A:
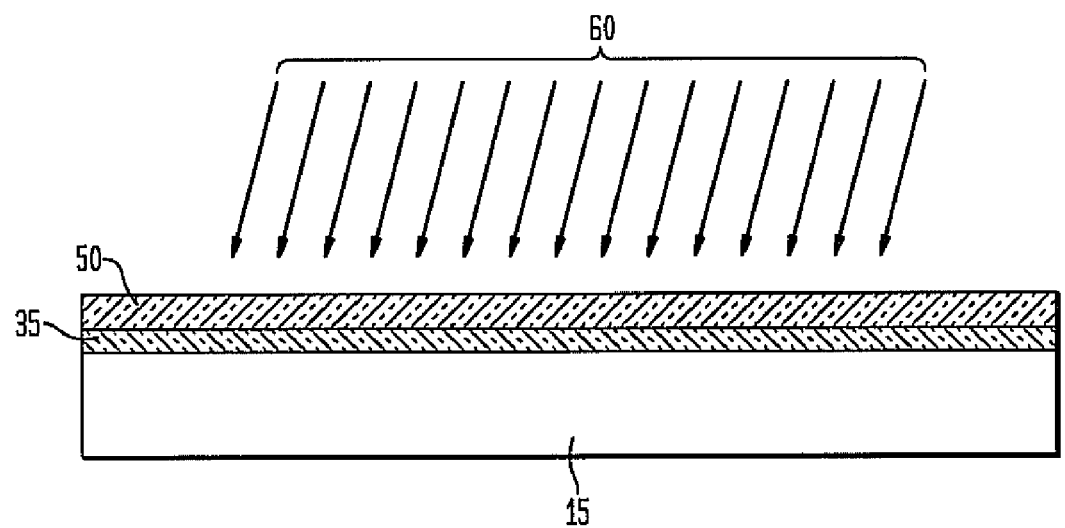

As shown in FIG. 2(a), there is provided a substrate 15 which may be a bulk semiconductor including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description, substrate 15 is a Si-containing semiconductor substrate of a first conductivity types, e.g., lightly doped with p-type dopant material such as boron or indium (beryllium or magnesium for a III-V semiconductor), to a standard concentration ranging between, e.g., $1 \times 10^{14}$ to $1 \times 10^{16}$ cm$^{-3}$. Next a dielectric material layer 35 is formed by standard deposition techniques atop the substrate 15 that will form the eventual transfer gate dielectric. The dielectric layer may be formed to a thickness ranging between 40 Å to 100 Å and may comprise suitable gate dielectric materials including but not limited to: an oxide (e.g., $SiO_2$), a nitride (e.g., silicon nitride) an oxynitride (e.g, Si oxynitride), $N_2O$, NO, $ZrO_2$, or other like materials. The dielectric layer 35 is formed on the surface of the Si-containing semiconductor substrate 15 using conventional thermal oxidation or by a suitable deposition process such as chemical vapor deposition, plasma-assisted chemical vapor deposition, evaporation, sputtering and other like deposition processes. Although it is not shown, it is understood that the dielectric layer may comprise a stack of dielectric materials.

Figure 1:
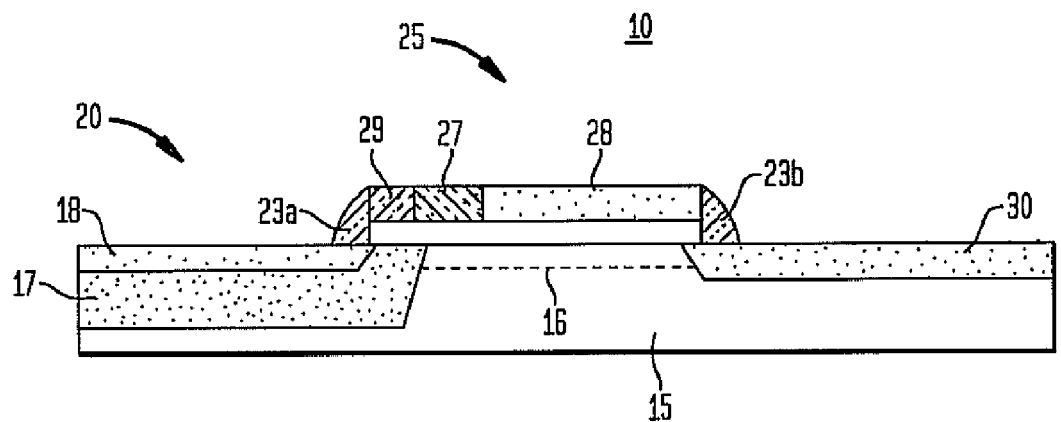
FIG. 1 depicts a CMOS image sensor pixel array 10 according to the prior art.

Next, a layer of polycrystalline silicon, i.e., intrinsic polysilicon 50, is formed atop the dielectric layer using conventional deposition processes including, but not limited to: CVD, plasma-assisted CVD, sputtering, plating, evaporation and other like deposition processes (e.g., a low pressure CVD) to provide the structure shown in FIG. 1. The polysilicon layer may be formed to a thickness ranging between about 1 k Å to 2 k Å but may be outside this range. After depositing the intrinsic polysilicon layer 50 on the gate dielectric layer a subsequent ion implantation process is performed to implant dopant material of a second conductivity type, e.g., n-type dopant material 60, such as phosphorus, arsenic or antimony, into the polysilicon layer. The n-type dopant material is blanket implanted at dosing concentrations ranging between $1 \times 10^{18}$ cm$^{-3}$ to $1 \times 10^{19}$ cm$^{-3}$.

Figure 3:
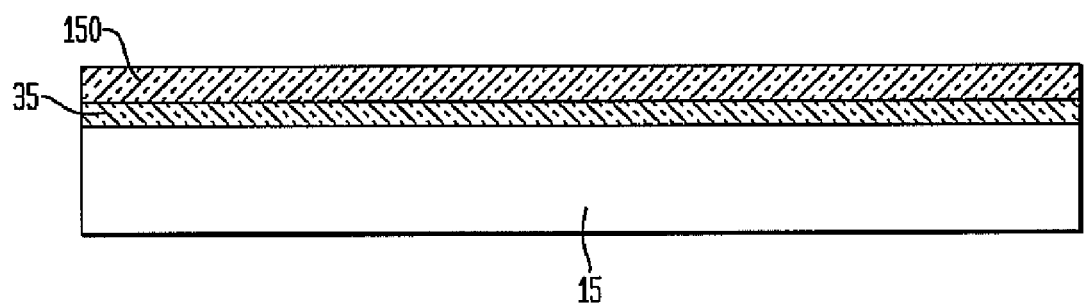
FIG. 3 illustrates, through a cross-sectional view, the formation of an-situ n-type doped polysilicon material deposited on top of the gate dielectric layer according to an in-situ doping deposition process or deposition.

It should be noted that in an alternative method, shown in FIG. 3, in-situ n-type doped polysilicon material 150 may be deposited on top of the gate dielectric layer 35 according to an in-situ doping deposition process or deposition (e.g., CVD, plasma-assisted, etc.). The in-situ doping deposition process, for example, may be employed when the gate dielectric cannot withstand a subsequent high temperature annealing, whereas ion implantation and annealing can be employed when the gate dielectric is a material that can withstand such high temperature annealing. The in-situ doped polysilicon layer 150 may be low level n– type doped to a concentration ranging from about $1 \times 10^{18}$ cm$^{-3}$ to $1 \times 10^{19}$ cm$^{-3}$, e.g., about $5 \times 10^{18}$ cm$^{-3}$.

Thus, whether the deposited intrinsic polysilicon is subsequently doped (FIG. 2(a)) or, after in-situ doped polysilicon layer is formed (FIG. 3), the transfer gate is then formed by the process depicted in FIG. 2(b), whereby a photo lithographic process is used to define the gate region, e.g., length determining an effective channel length, of the transfer gate to be formed. This step is not illustrated since there are many different ways how the lateral size and shape of the gate can be defined. Basically, an etch window is provided in a resist mask (not shown), the size and shape of which is about the same as the lateral size and shape of the gate region to be formed. Then, one or more etch processes are performed, e.g., a reactive ion etch (RIE) process, that is optimized to ensure proper etching of the doped polysilicon layer 50 and dielectric layer 35 or dielectric layer stack. The resulting structure of the transfer gate 125 having the n-type doped polysilicon layer 70 is shown in FIG. 2(b).

Figure 2D:
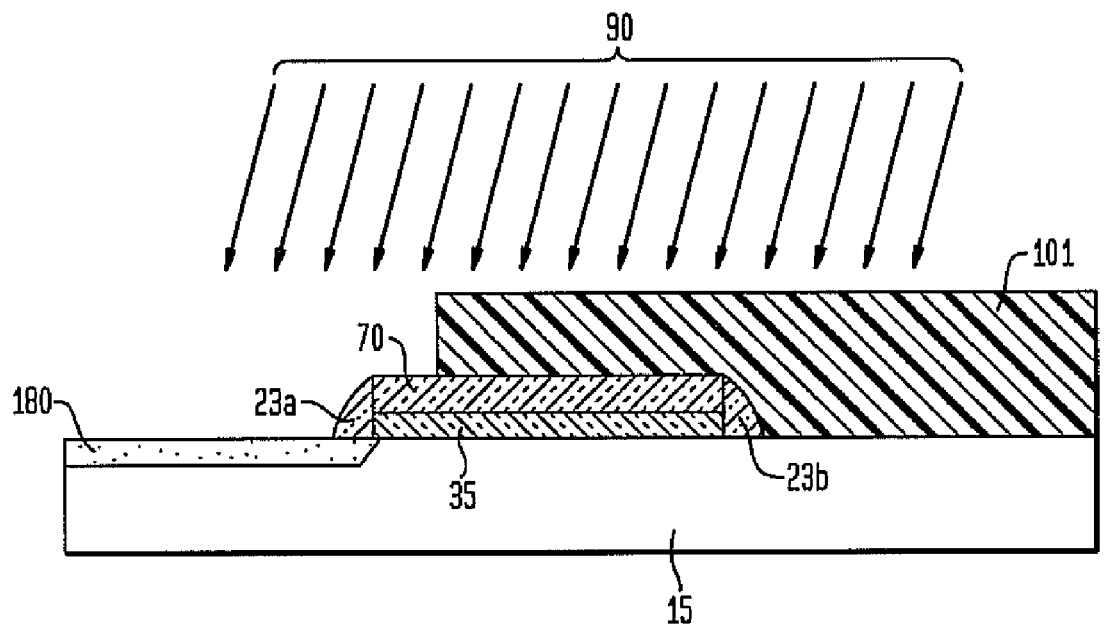

In a further step not shown, gate sidewall spacers 23a,b are formed at either side of the transfer gate by conventional deposition processes well known in the art, and may comprise any conventional oxide or nitride (e.g., $Si_3N_4$) or oxide/nitride and then they are etched by RIE or another like etch process. The thickness of spacers 23a,b may vary, but typically they have a thickness of from about 30 nm to about 150 nm. After forming spacers, a next step shown in FIG. 2(c), is performed to provide the photodiode pinning region. This step comprises forming a photoresist layer 101 patterning, and creating an ion implantation mask according to techniques known in the art to form a mask edge approximately coincident with the gate edge or as close as possible given alignment tolerances, to provide an opening to an area between an edge of the gate 70 and a formed isolation region, e.g., STI region (not shown), where the charge accumulation region of the photodiode is to be formed. This opening permits the implantation of ions 80 of p-type dopant material such as boron at a concentration sufficient to form the p-type dopant regions 180 as shown in FIG. 2(d) up to the edge of the spacer 23a. The active p-type dopant material is ion implanted at dosing concentrations ranging between $1 \times 10^{17}$ and $1 \times 10^{19}$ cm$^{-3}$.

Figure 2E:
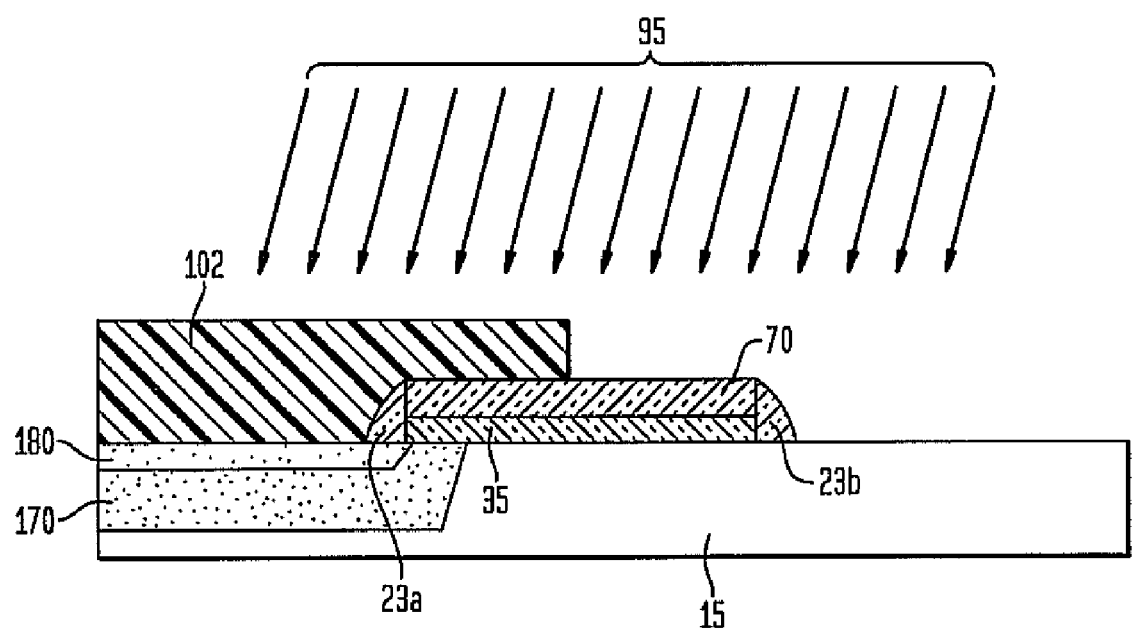

As further shown in FIG. 2(d), the further step is to ion implant the n-type doing region of the photodiode. Thus, using the same ion implantation mask 101, an ion implantation process is performed to implant dopant material of the second conductivity type, e.g., n-type dopant material 90, such as phosphorus, arsenic or antimony, to form the charge collection layer beneath the ion implanted p-type pinning layer 180. The n-type dopant material is implanted at higher energy levels to form the n-type doped region 170 of the photodiode 200 as shown in FIG. 2(e). The active n-type dopant material is ion implanted at dosing concentrations ranging between $1 \times 10^{16}$ and $1 \times 10^{18}$ cm$^{-3}$. As shown in FIG. 2(e), the photosensitive charge storage region 170 for collecting photo-generated electrons may be formed by multiple implants to tailor the profile of the n-type region 170. It is understood that an implantation angled relative to the gate surface may be conducted to form the p-type pinning layer 180 and n– type region 170. It should be understood that, alternatively, the p-type pinning photodiode surface layer 180 may be formed by other known techniques. For example, the p-type surface layer 180 may be formed by a gas source plasma doping process, or by diffusing a p-type dopant from the in-situ doped layer or a doped oxide layer deposited over the area where photodiode is to be formed.

Figure 2F:
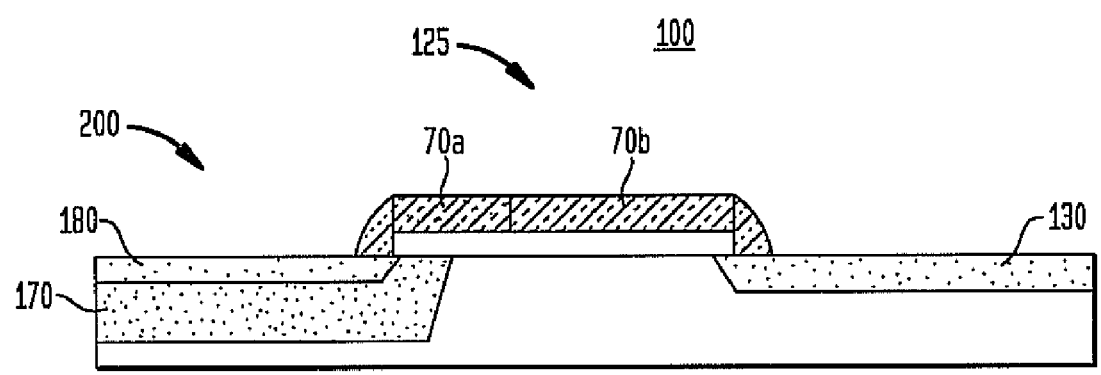

In addition to the forming of the photodiode 200, an additional step of forming an n-type floating diffusion region at the other side of the transfer gate is performed as shown in FIG. 2(e). This step comprises forming a photoresist layer 102 and patterning and etching an ion implantation mask according to techniques known in the art to form a mask edge approximately coincident with the gate edge or as close as possible given alignment tolerances, to provide an opening allowing the implantation of n-type dopant material 95, such as phosphorus, arsenic or antimony, at a concentration sufficient to form the n+-type doped floating diffusion region 130 as shown in FIG. 2(d) up to the edge of the spacer 23b as shown in the final structure depicted in FIG. 2(f). The active n+-type dopant material is ion implanted at the floating diffusion region at dosing concentrations ranging between $1\times10^{18}$ and $1\times10^{20}$. As a result of this ion implantation step, n-type dopant materials are additionally implanted at the doped gate polysilicon layer 70 as well. Thus, as a result of the predoping n-type process step shown in FIG. 2(a), the final CMOS APS cell structure 100 (FIG. 2(f)) includes a transfer gate having sufficiently doped n-type region 70a and an n+-type region 70b which avoids the Vt gate variations as compared to the prior art.

Simulation results show an improvement in efficiency beyond what would be expected merely by adding N+ doping to the gate of a normal (non APS) gate because of the elimination of the effect of the p-type pinning layer doping in the gate.

In other applications where there is a predoped gate, a consistently higher concentration may be needed to see a benefit. The invention achieves a benefit at lower concentrations by eliminating the affect of the pinning layer implant on the gate. High concentration gate implants can negatively affect etch characteristics, silicide growth, and spacer oxide width.

Figure 4:
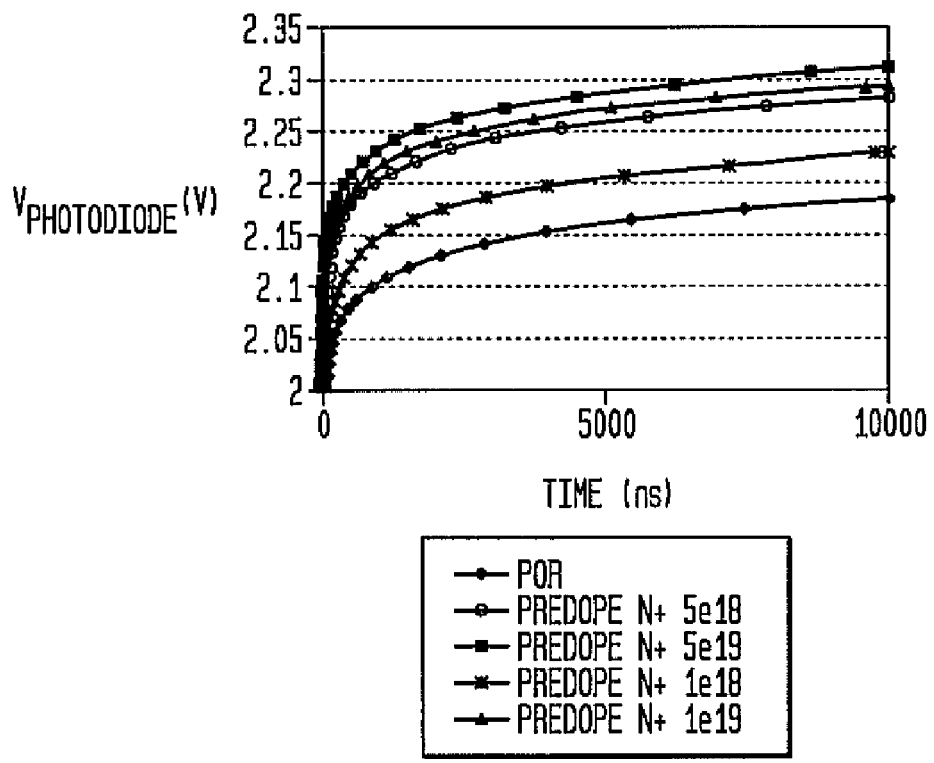
FIG. 4 depicts the relation between the voltage on the photodiode element 200 versus time under various example transfer gate pre-dope and voltage application conditions; and, FIG. 5 depicts a plot relating current through an example transfer gate with a large constant photoillumination versus time.

FIG. 4 depicts the relation between the voltage on the photodiode element 200 versus time under the following conditions: the photodiode begins with 0.0 volts (fully charged) on the source side of the transfer gate. The drain and the gate of the transfer gate have about 3.3V applied at time t=0. The photodiode voltage is now monitored with time in FIG. 4. Each of the different curves reflects different pre-dope dopant concentrations and the process of record. Higher photodiode voltages with time are desired if the transfer device leakage is identical as the higher photovoltages allow for a higher dynamic range and a better cell charge capacity. FIG. 4 particularly depicts an improvement in photodiode voltage of 50 mV at a pre-dope concentration of 1e18 $cm^{-3}$ as compared to the process of record (no transfer gate pre-dope), a 100 mV improvement at 5e18 $cm^{-3}$ pre-dope concentration and, an additional improvement to 120 mV at 5e19 $cm^{-3}$ pre-dope concentration. Most of this improvement is seen by the 5e18 $cm^{-3}$ pre-dope concentration.

Figure 5:
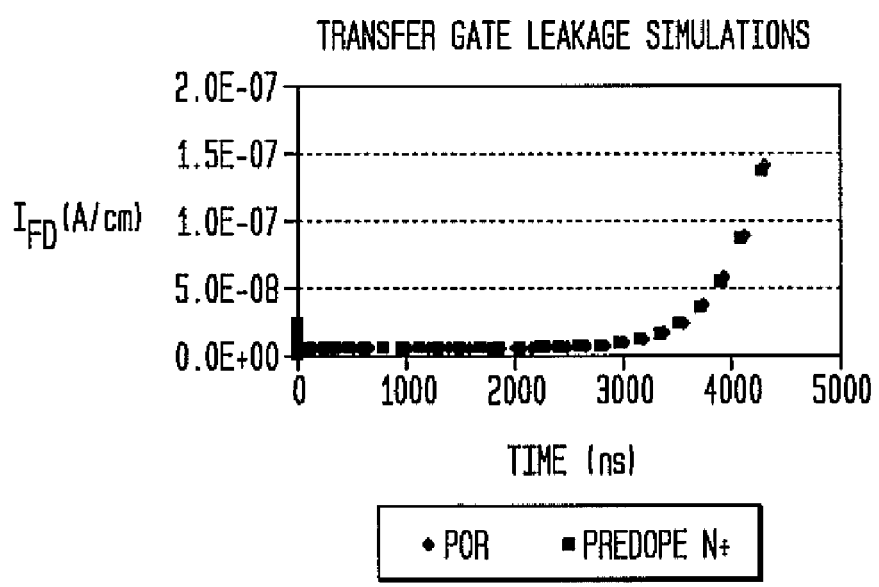

FIG. 5 depicts a plot relating current through an example transfer gate formed according to the invention with a large constant photoillumination versus time. This current stays very low until the photodiode exceeds its electron capacity. Since the pre-doped poly transfer gate and the POR overlap each other in these plots, they have the same transfer gate leakage. The combination of FIGS. 4 and 5 demonstrates improved photovoltage without degraded leakage characteristics as a result of predoping the transfer gate device.

Simulation results show that even for gate pre-dopings as low as 1e18, there is some improvement in dynamic range versus leakage. At 5e18, one gets a majority of the benefit. In order to integrate standard CMOS digital circuits on the same chip it is desired that the pFET transistor gates be doped p-type. As the pFET source/drain implants dope the gates to approximately the $5\times10^{19}$ $cm^{-3}$ to $1\times10^{21}$ $cm^{-3}$ range, it is important to keep the blanket pre-dope concentration below this dopant range (e.g., less 10%). As a result, a blanket implant of $5\times10^{18}$ $cm^{-3}$ provides the benefit of improved photodiode dynamic range and decreased variability due to alignment issues while still allowing the pFETs to be adequately doped p+ through the use of the source/drain implants.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

The invention claimed is:

1. A method of forming an Active Pixel Sensor (APS) cell structure comprising the steps of:
   a. forming a layer of dielectric material over a semiconductor substrate;
   b. forming a gate layer of polysilicon material atop said dielectric material layer;
   c. doping said gate layer of polysilicon material with an n-type dopant material;
   d. performing an etch process to said n-type doped gate layer to form a predoped transfer gate;
   e. forming a p-type doped material pinning layer using a first angled ion implantation into said substrate surface at a first side of said predoped transfer gate, wherein the predoped transfer gate is protected by a first block mask that is formed in direct contact with an entire upper surface of the polysilicon material of the predoped transfer gate, wherein the first angled implant and the first block mask prevent dopant from the first angled ion implantation from being introduced to the predoped transfer gate;
   f. forming an n-type doped collection well area beneath said p-type doped material pinning layer using a second angled ion implantation, wherein the first block mask protects the predoped transfer gate, wherein the second angled implant and the first block mask prevent dopant from the second angled ion implantation from being introduced to the predoped transfer gate; and
   g. forming a n-type doped diffusion layer at said substrate surface at an opposite side of said predoped transfer gate, using a third angled ion implantation, wherein a portion of the predoped transfer gate is protected by a second block mask that is formed in direct contact with a portion of an upper surface of the polysilicon layer of the predoped transfer gate, wherein an exposed portion of the predoped transfer gate is doped by the third angled ion implantation to an n+-type conductivity, and a remaining portion of the predoped transfer gate has an n-type conductivity.

2. The method as claimed in claim 1, wherein said step c) of doping said gate layer of polysilicon material with an n-type dopant material comprises blanket doping said n-type dopant material by ion implantation.

3. The method as claimed in claim 2, wherein said n-type dopant material by ion implanted to a concentration ranging between $1\times10^{18}$ $cm^{-3}$ to $1\times10^{19}$ $cm^{-3}$.

4. The method as claimed in claim 1, wherein prior to said step e), the step of forming sidewall spacer structures along sidewalls of said predoped transfer gate.

5. The method as claimed in claim 4, wherein said first block mask comprises a first photoresist mask structure defining an ion implant opening having an edge thereof in alignment with a first edge of said predoped transfer gate.

6. The method as claimed in claim 4, wherein said second block mask comprises a second photoresist mask structure defining an ion implant opening having an edge thereof in alignment with a second edge of said predoped transfer gate.

7. A method of forming an Active Pixel Sensor (APS) cell structure comprising the steps of:
  a. forming a layer of dielectric material over a semiconductor substrate;
  b. forming a gate layer of polysilicon material in-situ doped with n-type dopant material atop said dielectric material layer;
  c. performing an etch process to said n-type doped gate layer to form a predoped transfer gate;
  d. forming a p-type doped material pinning layer using a first angled ion implantation into said substrate surface at a first side of said predoped transfer gate, wherein the predoped transfer gate is protected by a first block mask that is formed in direct contact with an entire upper surface of the polysilicon material of the predoped transfer gate, wherein the first angled implant and the first block mask prevent dopant from the first angled ion implantation from being introduced to the predoped transfer gate;
  e. forming an n-type doped collection well area beneath said p-type doped material pinning layer using a second angled ion implantation, wherein the first block mask protects the predoped transfer gate, wherein the second angled implant and the first block mask prevent dopant from the second angled ion implantation from being introduced to the predoped transfer gate; and
  f. forming a n-type doped diffusion layer at said substrate surface at an opposite side of said predoped transfer gate, using a third angled ion implantation, wherein a portion of the predoped transfer gate is protected by a second block mask that is formed in direct contact with an upper surface of the polysilicon material of the predoped transfer gate, wherein an exposed portion of the predoped transfer gate is doped by the third angled ion implantation to an n+-type conductivity, and a remaining portion of the predoped transfer gate has an n-type conductivity.

8. The method as claimed in claim 7, wherein said n-type dopant material is in-situ doped to a concentration ranging between $1 \times 10^{18}$ cm$^{-3}$ to $1 \times 10^{19}$ cm$^{-3}$.

* * * * *